(12) United States Patent
Kawanishi

(10) Patent No.: US 6,228,562 B1
(45) Date of Patent: May 8, 2001

(54) METHOD FOR MANUFACTURING RECORDING ORIGINAL DISC FOR OPTICAL INFORMATION RECORDING MEDIA

(75) Inventor: Yoshitaka Kawanishi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/729,417

(22) Filed: Oct. 11, 1996

(30) Foreign Application Priority Data

Oct. 13, 1995 (JP) ................................................ 7-265513

(51) Int. Cl.⁷ ............................................................ G11B 7/26
(52) U.S. Cl. ..................... 430/321; 430/945; 430/312; 430/320; 369/275.4; 216/47; 216/24; 216/51
(58) Field of Search ................................. 430/311, 312, 430/320, 321, 945; 369/84, 275.4; 216/47, 51, 43, 24

(56) References Cited

U.S. PATENT DOCUMENTS

| 4,057,831 | * | 11/1977 | Jacobs et al. | .......................... | 368/84 |
| 4,619,804 | * | 10/1986 | Leonard et al. | ........................ | 216/24 |

(List continued on next page.)

FOREIGN PATENT DOCUMENTS

| 0418897 | * | 3/1991 | (EP). | | |
| 61-240452 | | 10/1986 | (JP). | | |
| 63-71957 | * | 4/1988 | (JP). | ................................. | 369/275.4 |
| 1-248336 | * | 10/1989 | (JP). | ................................. | 369/275.4 |
| 0264942 | | 3/1990 | (JP). | | |
| 2-245321 | * | 10/1990 | (JP). | ....................................... | 216/47 |
| 2281932 | | 11/1990 | (JP). | | |
| 3-100942 | * | 4/1991 | (JP). | ................................... | 369/275.4 |
| 3-108141 | | 5/1991 | (JP). | | |
| 4-248145 | | 9/1992 | (JP). | | |
| 5-314544 | * | 11/1993 | (JP). | | |
| 7-302443 | * | 11/1995 | (JP). | | |

OTHER PUBLICATIONS

Thompson et al. "Introduction to Microlithography" ACS pp. 214–285, 1983.*

(List continued on next page.)

*Primary Examiner*—Martin Angebranndt
(74) *Attorney, Agent, or Firm*—Sughrue, Mion, Zinn, Macpeak & Seas, PLLC

(57) ABSTRACT

A recording original disc (18) for optical discs is manufactured by the following steps: a first step for forming a lower layer (12), an intermediate layer (14) and an upper layer (16) of photoresist on the surface of a substrate (10), a second step for exposing the upper layer (16) to light to form a pattern corresponding to recording information on the upper layer (16) and developing the upper layer (16), a third step for etching the intermediate layer (14) while using the upper layer (16) which has been exposed to light and developed in the second step, a fourth step for etching the lower layer (12) while using as a mask the intermediate layer (14) etched in the third step, and a fifth step for removing the residual intermediate layer. An intermediate step for applying far ultraviolet radiation to the upper layer (16) and then subjecting the upper layer (16) to a heat treatment. Representing the thickness of the intermediate layer (14) and the thickness of the upper layer (16) formed in the first step by D and d respectively, and representing the etching ratio of the intermediate layer (14) to the upper layer (16) by n, the relationship: D≦ is achieved. The etching ratio of the lower layer (12) to the intermediate layer (14) in the fourth step is set to 10 or more.

26 Claims, 13 Drawing Sheets

U.S. PATENT DOCUMENTS

| | | | | |
|---|---|---|---|---|
| 4,716,063 | * | 12/1987 | Uehara et al. | 430/945 |
| 4,747,093 | * | 5/1988 | Benne et al. | 369/280 |
| 5,108,870 | * | 4/1992 | Shalom | 430/190 |
| 5,284,435 | * | 2/1994 | Nuij et al. | 425/385 |
| 5,503,963 | * | 4/1996 | Bifano | 430/320 |
| 5,521,030 | * | 5/1996 | McGrew | 430/320 |

OTHER PUBLICATIONS

Elliott, David J., "Integrated Curcuit Fabrication Technolgy" McGraw–Hill, Inc., pp 34–37,233–243 and 364–367, 1982.*

ACS Symposium Series 219, pp 161–231 and 287–350, 1983.*

Thompson et al., "introduction to Microlithography" ACS pp. 233–243 and 287–349, 1983.*

* cited by examiner

METHOD FOR MANUFACTURING RECORDING ORIGINAL DISC FOR OPTICAL INFORMATION RECORDING MEDIA

BACKGROUND OF THE INVENTION

1. Field of the Invention

The present invention relates to a method for manufacturing a recording original disc for optical information recording media (optical discs such as video discs, compact discs, etc., for example), and particularly to a method for manufacturing a recording original disc which is suitable to enhance recording density.

2. Description of Related Art

First, a conventional method for manufacturing optical discs will be described. The optical discs are manufactured through a recording original disc manufacturing process, an electroforming process, and a replication process as described below.

a. Recording original disc manufacturing process

In this process, a recording original disc which is used to produce a stamper having a surface shape to be transferred onto optical discs is manufactured.

First, a glass substrate is sufficiently cleaned, then silane coupling agent is vaporized to be adsorbed by the glass substrate so that a photoresist layer is well formed without being peeled off in a next process, that is, the glass substrate is subjected to an adhesion agent treatment. After being dried, photoresist is uniformly coated on the glass substrate by a spin coat method, and then the photoresist layer is exposed to light by a laser cutting method to form a latent image of recording pits. Subsequently, developer is dropped onto the glass substrate while rotating the glass substrate to develop the latent image of the photoresist layer, thereby obtaining a recording original disc.

b. Electroforming process

In this process, a stamper is manufactured by using the recording original disc.

First, in order to provide the recording original disc with conductivity, a Ni thin film having a thickness of about 100 nm is formed on the surface of the recording original disc by a Ni sputtering method, and then subjected to an electroplating treatment in nickel sulfamate bath while the Ni thin film is used as a cathode and depolarized nickel having high solution efficiency is used as an anode. The electroplated Ni plate and the Ni thin film are exfoliated from the recording original disc, and the photoresist adhering to the surface of the recording original disc is removed to obtain a master disc. The master disc may be used as a master stamper by polishing the back surface thereof. However, it is normally adopted that the oxidation treatment and the electroforming treatment are repeatedly performed on the surface layer of the master disc to form a mother disc, and a stamper is manufactured by using the mother disc. With this operation, about twenty five stampers are manufactured from one master disc.

c. Replication process

In this process, an optical disc substrate having recording pits is manufactured by using the stamper.

First, a resin pellet for a substrate is sufficiently dried. A stamper is secured to a movable mold of an injection molding machine, and a heated and melted resin for the substrate is injected into a cavity between the stamper and a fixed mold having a mirror-polished surface. The injected resin is compressed and kept in pressure, and then forcedly cooled to form an optical disc substrate. Thereafter, the optical disc substrate thus formed is removed from the molding machine.

FIG. 1 is a schematic cross-sectional view showing an optical disc which is manufactured by a conventional method as described above. A metal reflection film 54 and a resin protection film 56 are formed on an optical disc substrate 52 manufactured through the processes a to c as described above, thereby obtaining an optical disc 50.

With the conventional optical disc 50 thus formed, the recording pits (recess portions) 57 of the disc 50 are unintentionally formed to have slant surfaces at the side walls 58 thereof (that is, the side walls of the optical disc are not perpendicular or vertical to the optical disc surface), that is, so-called sag occurs. Therefore, reproduction signals are disturbed due to the sag, and this obstructs the design of the recording pits 57 having high fineness and high recording density.

The cause of occurrence of the sag as described above will be described below.

FIG. 2 is a cross-sectional view showing the recording original disc manufacturing process in the conventional technique as described above. A photoresist layer 64 is formed on a glass substrate 62, and a laser beam L is irradiated to the photoresist layer 64 to perform an exposure process. The photoresist layer 64 thus exposed is developed to form recess portions 66 serving as recording pits as shown in FIG. 2, thereby forming a recording original disc 60. Since the intensity of the laser beam L has a Gaussian distribution, a latent image which is formed on the photoresist layer 64 in the exposure process of the laser beam L also has a shape corresponding to a substantially Gaussian distribution. That is, the sectional shape of a recess portion 66 is changed from a shape indicated by a through shapes indicated by b, c and d to a shape indicated by e with the progress of the development. Accordingly, sag corresponding to a spread of an edge portion of the Gaussian distribution of the laser beam L occurs, and this sag is copied onto the optical disc substrate 52.

In order to solve the "slant surface" problem of the side walls of the recording pits as described above, Japanese Patent Application Laid-open No. 3-108141 and Japanese Patent Application Laid-open No. 4-248145 have proposed techniques for forming recess portions of a recording original disc by etching an etching layer through opening portions of a photoresist layer. According to these techniques, in consideration of the fact that if the recess portions are formed by an exposure process using a laser beam, the side walls of the recess portions are designed to be slanted because the intensity of the laser beam has a Gaussian distribution, the recess portions are formed by using an etching process in place of the exposure process of the laser beam to prevent occurrence of slant side walls in the recess portions.

This method will be described with reference to FIGS. 3A to 3C. First, as shown in FIG. 3A, a layer 72 which will be subjected to an etching treatment (hereinafter referred to as "etching-applied layer") and a photoresist layer 74 are formed or laminated on the substrate 70, and the photoresist layer 74 is exposed to a laser beam hv in a desired pattern to form a latent image. Subsequently, the latent image of the photoresist layer 74 is developed to form opening portions 76 corresponding to recording information as shown in FIG. 3B, and then an etching treatment is performed with using the photoresist layer 74 as a mask. Thereafter, the residual photoresist layer 74 is removed to form recess portions 78 in the etching-applied layer 72 as shown in FIG. 3C, thereby obtaining a recording original disc 80. An optical disc is manufactured by using this recording original disc 80.

In the optical disc manufacturing process as described above, it is important that the side walls of the recess portions serving as recording pits are formed in a vertical direction to the surface of the optical disc, i.e. perpendicular to the disc surface, in order to enhance the recording density with keeping an excellent reproduction signal characteristic.

However, in the manufacturing method of the recording original disc shown in FIGS. 3A to 3C, it is difficult to achieve a process which simultaneously satisfies both high vertical anisotropy and high etching selectivity because the photoresist is used as an etching mask. FIG. 4 is a cross-sectional view showing the recording original disc to explain the above-mentioned difficulty. In FIG. 4, if the opening portion 76 is formed in the photoresist layer 74 which is formed on the etching-applied layer 72 on the substrate 70 and the etching treatment using an ion beam I is performed, the shape of the photoresist layer 74 in which the opening portion 76 is formed is gradually degraded with the progress of the etching because sufficient selectivity is not obtained. Another cause of the degradation of the edge portion of the photoresist layer 74 resides in that the edge portion is formed to have a slant surface as described above, and thus it is liable to suffer the impact of the ion beam I. Accordingly, the shape of the opening portion 76 of the photoresist layer 74 and the shape of the recess portion 78 of the etching-applied layer 72 are changed from the shape indicated by a virtual line 801 through the shape indicated by a virtual line 802 to the shape indicated by a virtual line 803 with the progress of the etching treatment. Like this, the side walls 781 of the recess portion 78 are also designed to have slant surfaces, and thus they are not formed vertically to the substrate 70. Therefore, according to the conventional techniques as described above, it is unavoidable that the side walls of the recording pits are formed to be slanted, and thus it is difficult to achieve the high recording density of the optical disc.

SUMMARY OF THE INVENTION

Therefore, an object of the present invention is to easily form recording recess portions of an optical information recording medium such as an optical disc so that the side walls of the recess portions are not slanted, but are vertical to the surface of the optical information recording medium. Particularly, an object of the present invention is to provide a method of manufacturing a recording original disc to obtain recording media having high information recording density.

In order to attain the above objects, a first method for manufacturing a recording original disc for optical information recording media according to the present invention comprises a first step for laminating a lower layer of a first etching-applied material, an intermediate layer of a second etching-applied material and an upper layer of photoresist on the surface of a substrate in this order, a second step for exposing the upper layer to light to form a pattern corresponding to recording information on the upper layer and then developing the pattern, a third step for etching the intermediate layer while using as a mask the upper layer exposed and developed in the second step, and a fourth step for etching the lower layer while using as a mask the intermediate layer etched in the third step.

According to a second method for manufacturing a recording original disc for optical information recording media according to the present invention, the method includes a first step for laminating an intermediate layer of an etching-applied material, and an upper layer of photoresist on the surface of a substrate in this order, a second step for exposing the upper layer to light to form a pattern corresponding to recording information on the upper layer and then developing the pattern, a third step for etching the intermediate layer while using as a mask the upper layer exposed and developed in the second step, and a fourth step for etching the substrate while using as a mask the intermediate layer etched in the third step.

In the first and second methods, a fifth step for removing the residual intermediate layer may be provided subsequently to the fourth step.

An intermediate step for exposing the upper layer to far ultraviolet radiation may be provided between the second and third steps.

An intermediate step for exposing the upper layer to far ultraviolet radiation and then subjecting the upper layer to a heat treatment may be provided between the second and third steps.

Representing the thickness of the intermediate layer and the thickness of the upper layer formed in the first step by D and d, and representing the etching selection ratio of the intermediate layer to the upper layer in the third step by n, it is preferable to satisfy the following relationship: $D \leq (n \times d)$.

The etching selection ratio of the lower layer or the substrate to the intermediate layer in the fourth step is preferably equal to 10 or more.

When the first etching-applied material or the substrate to be etched in the fourth step is formed of organic material, a pretreatment step for exposing the lower layer or the substrate to far ultraviolet radiation or electron beams may be provided before the first step.

When the first etching-applied material or the substrate to be etched in the fourth step is formed of an organic material, a pretreatment step for exposing the lower layer or the substrate to far ultraviolet radiation or electron beams and then subjecting the lower layer or the substrate to a heat treatment may be provided before the first step.

According to the present invention as described above, the lower layer or the substrate is etched with using the intermediate layer as a mask to form recess portions of a recording original disc. Therefore, high vertical anisotropy which has not been obtained by the conventional method of forming the recess portions of the recording original disc with using the photoresist layer as a mask can be easily obtained. Accordingly, the side walls of the recess portions of the recording original disc can be easily designed to be perpendicular to the surface of the substrate, thereby enhancing the recording density of the optical information recording medium.

DESCRIPTION OF THE PREFERRED EMBODIMENTS

Preferred embodiments according to the present invention will be described with reference to the accompanying drawings.

FIGS. 5A to 5I are cross-sectional views showing a series of steps of a manufacturing method for a recording original disc according to the present invention.

Figure 1:
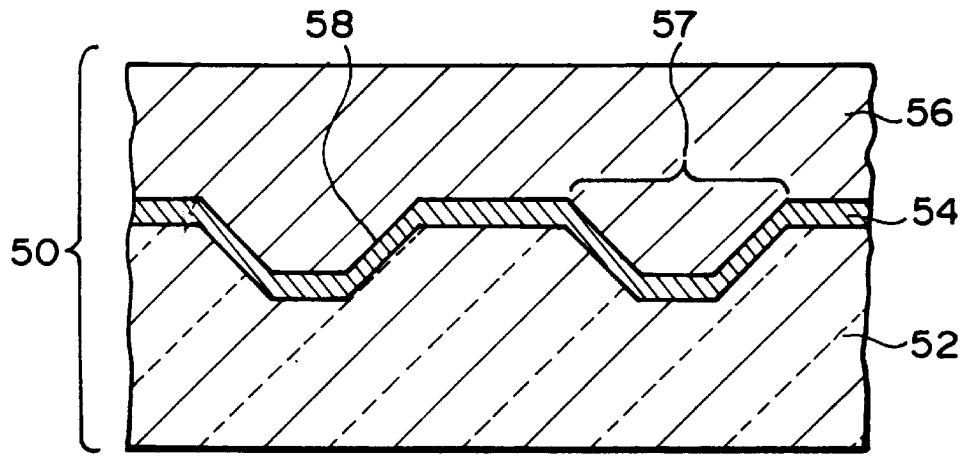
FIG. 1 is a schematic cross-sectional view showing an optical disc which is manufactured by a conventional method.
Figure 2:
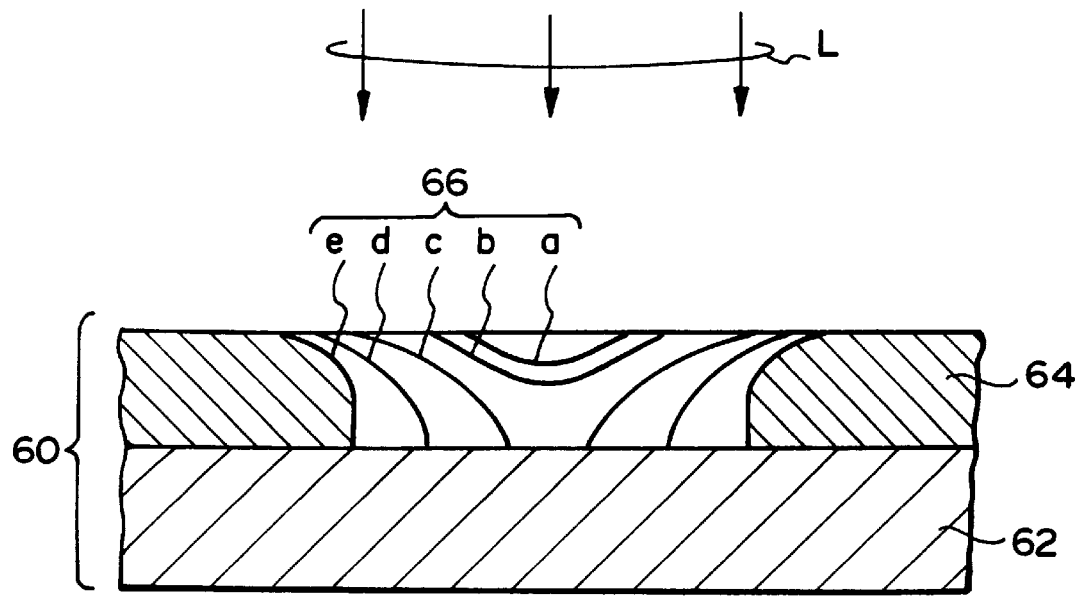
FIG. 2 is a cross-sectional view showing a conventional method of manufacturing a recording original disc.
Figure 3A:
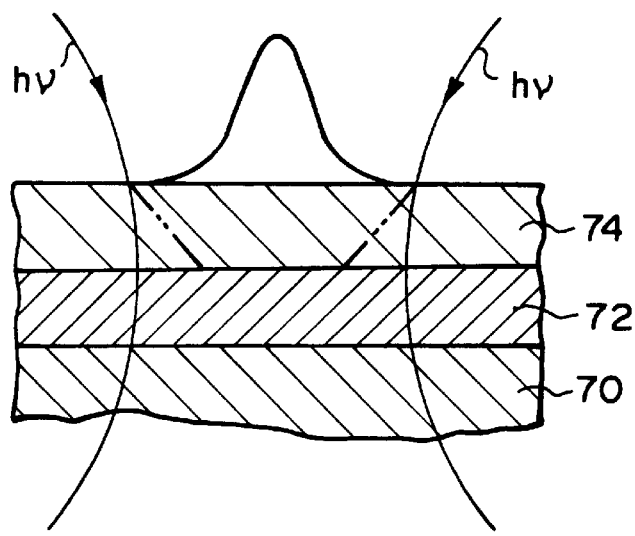
FIGS. 3A to 3C are cross-sectional views showing another conventional method of manufacturing a recording original disc.
Figure 3B:
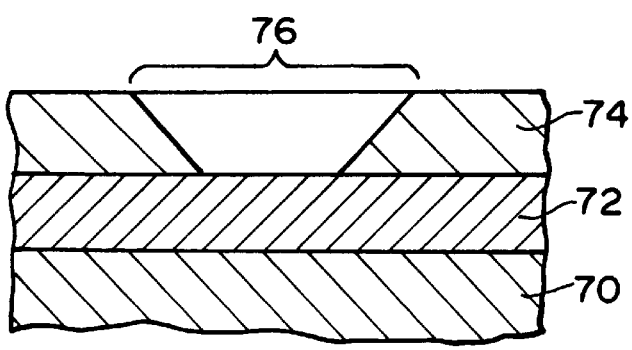
Figure 3C:
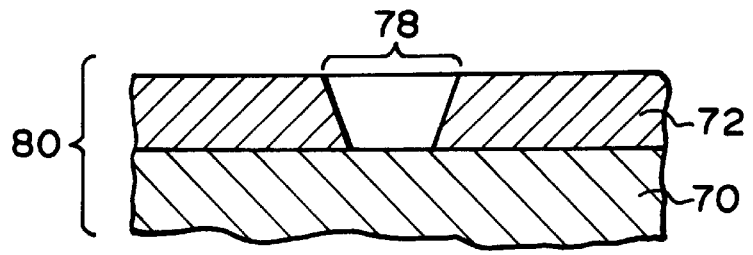
Figure 4:
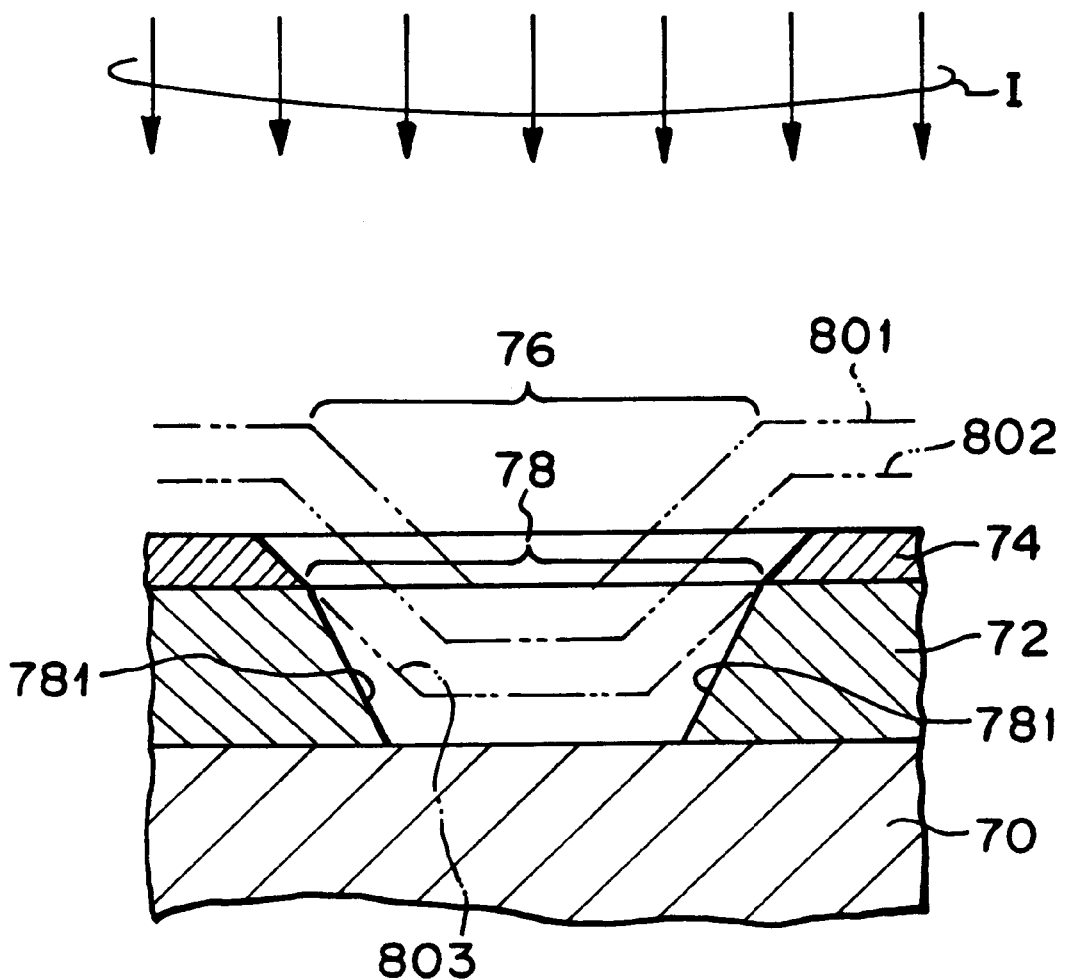
FIG. 4 is a cross-sectional view showing an etching progress status in the method shown in FIGS. 3A to 3C.
Figure 5A:
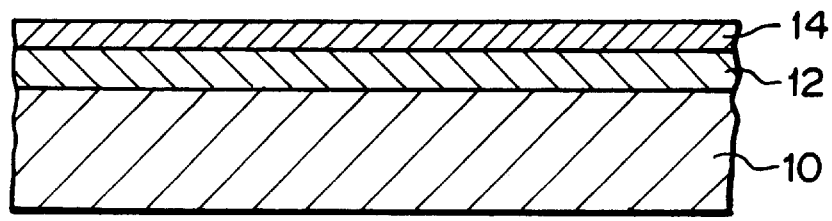
FIGS. 5A to 5I are cross-sectional views showing a series of steps of a manufacturing method for a recording original disc according to the present invention.

First, as shown in FIG. 5A, a lower layer 12 of a first etching-applied material is formed on a substrate 10, and then an intermediate layer 14 of a second etching-applied material is formed on the lower layer 12.

As the substrate 10 may be used an inorganic material such as silicon (Si), silicon oxide ($SiO_2$), silicon nitride ($Si_3N_4$), aluminum (Al), chromium (Cr), nickel (Ni), chemical strengthened glass, quartz glass, synthetic quartz glass, aluminum alloy or stainless steel, or an organic material such as polymethylmethacrylate (PMMA), polycarbonate (PC), amorphous polyolefine (APO) or epoxy resin. The surface (upper surface) of the substrate 10 has high flatness. In order to attain high flatness, the surface of the substrate 10 may be subjected to a surface treatment by a polishing treatment or the like.

The lower layer 12 is a layer in which recesses corresponding to information pits, grooves or the like are formed, and thus it is important to design the lower layer so as to have high anisotropy and high selection ratio when it is etched with using the intermediate layer 14 as a mask in a subsequent process. As the first etching-applied material constituting the lower layer 12 having such characteristics may be used an inorganic material such as Si, $SiO_2$, $Si_3N_4$, spin-on-glass (SOG), Al, Cr or aluminum alloy (AlSi, AlSiCu or the like), or an organic material such as polyvinyl cinnamate, mixture of polyvinyl phenol and aromatic bisazide, mixture of alkali soluble phenol resin and naphthoquinone diazide, polymethyl methacrylate (PMMA), mixture of diazomethyl drum acid and novolak, compound of cresol novolak and naphthoquinone diazide, polyhexafluorobutylmethacrylate (FBM), polybutenesulfone (PBS), chloromethylated polystyrene (CMS), polycarbonate (PC), amorphous polyolefine (APO) or epoxy resin. However, the first etching-applied materials is not limited to the above materials, and any suitable material which meets the above requirement may be used. The thickness of the lower layer 12 is preferably set to $\lambda/4n$ where $\lambda$ represents the information reproduction wavelength of the optical disc and n represents the refractive index of the substrate of the optical disc, and for example it is set to about 60 to 100 nm.

Since the intermediate layer 14 is a layer in which a mask used to etch the lower layer 12 in a subsequent step will be formed, it is important that the intermediate layer 14 remains unchanged when the upper layer is exposed to the beam in a subsequent step, and also developer (alkali water solution or the like) for developing the upper layer is prevented from invading into the intermediate layer 14. As the second etching-applied material constituting the intermediate layer 14 may be used Si, $SiO_2$, $Si_3N_4$ or the like. However, it is not limited to these materials, and any suitable material may be used insofar as it meets the above requirement. The thickness of the intermediate layer 14 is set to about 20 to 150 nm, for example.

When the substrate 10 or the lower layer 12 is formed of an organic material, they may be exposed to far ultraviolet radiation or electron beams or subjected to a heat treatment in order to enhance their heat resistance and resistance to etching.

Figure 5B:
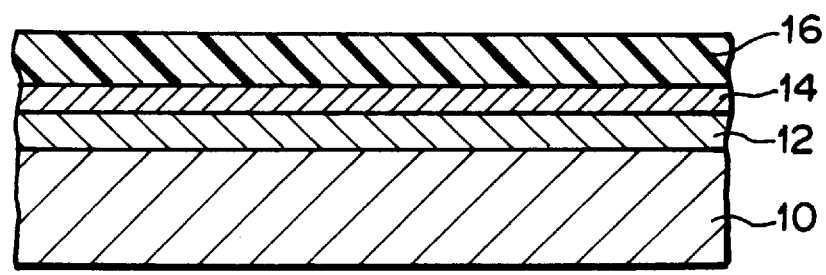

Subsequently, the upper layer 16 is coated on the intermediate layer 14 by the spin coat method as shown in FIG. 5B. Since the upper layer 16 is a layer in which a mask used to etch the intermediate layer 14 in a subsequent step will be formed, the upper layer 16 is required to be photosensitive to the exposure beam to form the mask. As the photoresist constituting the upper layer 16 may be used a positive type photoresist such as photoresist of orthodiazonaphthoquinone group (OFPR800 [produced by Tokyo Applied Chemicals Co., Ltd.], AZ1350J [produced by Shipley Co., Ltd.], etc.). However, it is not limited to these materials, and any suitable material may be used insofar as it meets the above condition. The thickness of the upper layer 16 is set to about 50 to 150 nm, for example.

The first step is realized by the process shown in FIGS. 5A and 5B.

Figure 5C:
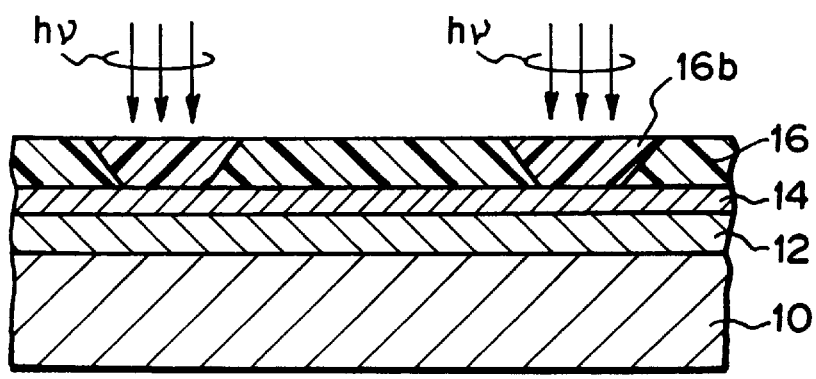

Subsequently, the upper layer 16 is exposed to light in a pattern corresponding to recording information as shown in FIG. 5C. Since the intensity distribution of the exposure beam hv is a Gaussian distribution, the shape of the latent image 16b which is formed on the upper layer 16 by the exposure is also a substantially Gaussian distribution, and thus the side walls thereof are slanted.

Figure 5D:
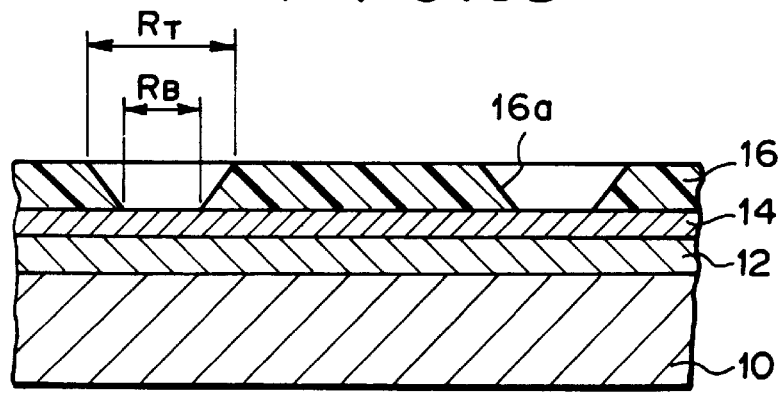

Subsequently, as shown in FIG. 5D, the upper layer 16 is developed to remove the portion of the latent image 16b. An opening portion 16a which is formed by the developing process meets the following relationship: $R_T > R_B$ where $R_T$ represents the top opening width and $R_B$ represents the bottom opening width because the shape of the opening portion 16a is also reflected by the Gaussian distribution of the intensity of the exposure beam hv. For example, $R_T$ is set to 0.4 $\mu$m, and $R_B$ is set to 0.2 $\mu$m.

The second step is realized by the process shown in FIGS. 5C and 5D.

Figure 5E:
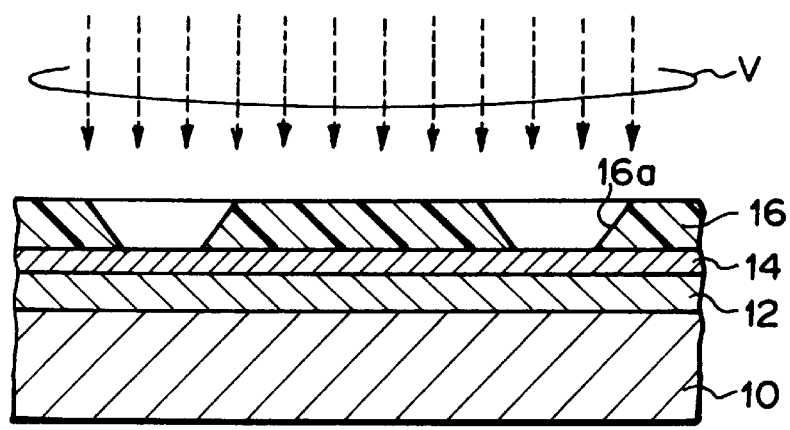

Subsequently, in order to enhance the resistance of the upper layer 16 having the recess portions 16a to heating and dry etching, far ultraviolet radiation V having a wavelength of 250 to 300 nm is applied to the whole surface of the upper layer 16 as shown in FIG. 5E. With this process, photoresist molecules are cross-linked to enhance the heat resistance, etc. The application of the far ultraviolet radiation V is carried out for about 3 minutes by using an Xe—Hg lamp of 500 W and a cold mirror of 250 nm. Further, in order to enhance the heat resistance and the dry etching resistance of the upper layer 16, the upper layer 16 is subjected to the heat treatment. With this treatment, the photoresist molecules are cross-linked to further enhance the heat resistance, etc. The temperature of the heat treatment is set to about 270° C.

The intermediate step is realized by the process shown in FIG. 5E.

Figure 5F:
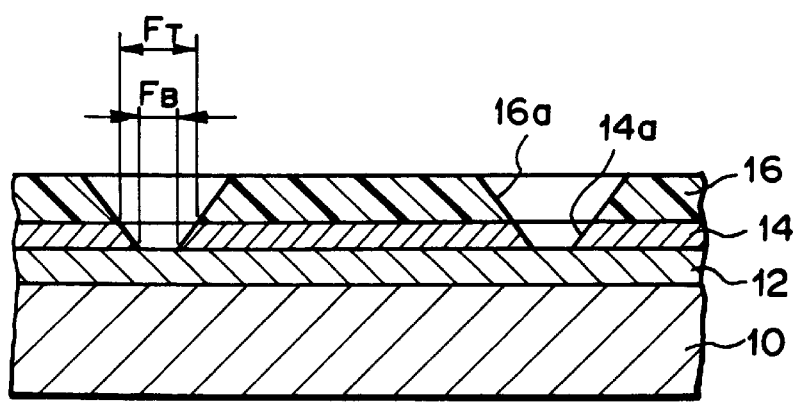

Subsequently, a reactive ion etching (RIE) is carried out by using the upper layer 16 as a mask to etch the intermediate layer 14 as shown in FIG. 5F. With this process, an opening portion 14a is formed in the intermediate layer 14. The following relationship: $R_T \geq F_T \geq R_B \geq F_B$ is satisfied where $F_T$ represents the top opening width of the opening portion 14a, and $F_B$ represents the bottom width of the opening portion 14a.

Figure 5G:
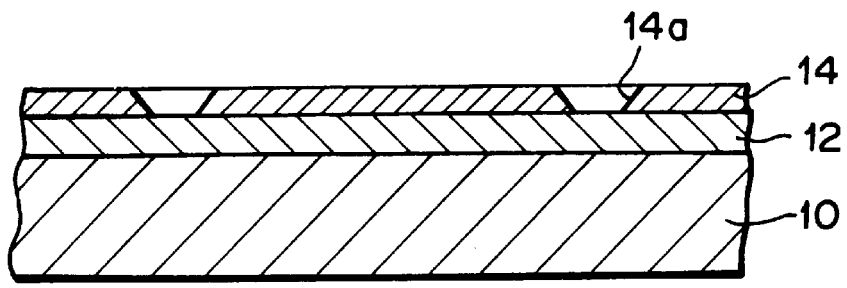

Subsequently, the residual upper layer 16 is removed as shown in FIG. 5G. An ashing treatment using oxygen plasma is used to remove the residual upper layer 16. The ashing treatment of FIG. 5G would be unnecessary if the upper layer 16 is perfectly removed in the reactive ion etching (RIE) of FIG. 5F.

The third step is realized by the process of FIGS. 5F to 5G.

Figure 5H:
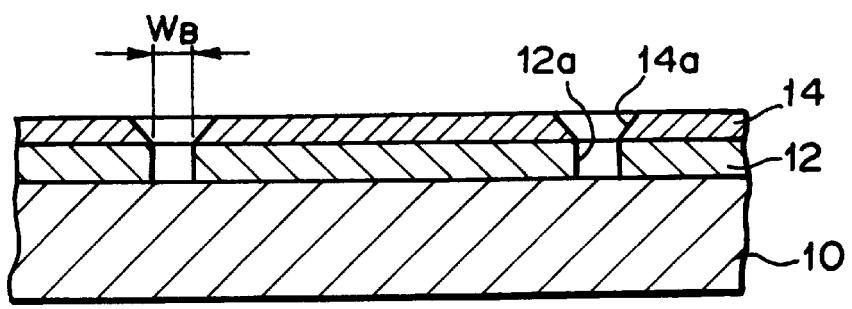

Subsequently, the RIE is carried out by using the intermediate layer 14 as a mask to etch the lower layer 12 as shown in FIG. 5H. With this process, opening portions (recess portions) 12a are formed in the lower layer 12. The side walls of the opening portions 12a are substantially vertical or perpendicular to the surface of the substrate 10, and the following relationship: $R_B = F_B = W_B$ is satisfied where the bottom opening width is represented by $W_B$.

The fourth step is realized by the process shown in FIG. 5H.

Figure 5I:
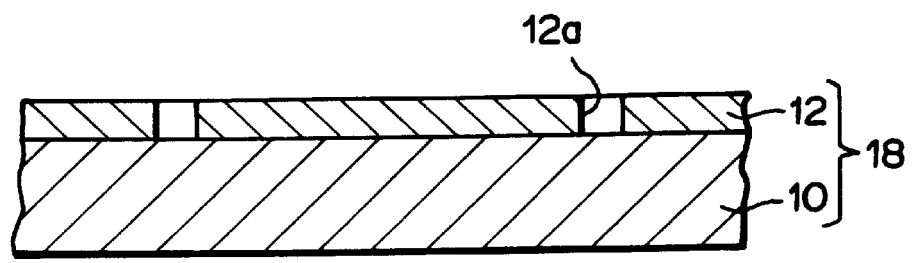

Subsequently, the residual intermediate layer 14 is removed by the dry or wet etching as shown in FIG. 5I. If the thickness of the intermediate layer 14 is equal to or smaller than the half of the thickness of the lower layer 12, i.e. the depth of the recess portions 12a, the intermediate layer 14 may be left without carrying out the process shown in FIG. 5I.

The fifth step is realized by the process shown in FIG. 5I.

With the above processes, a recording original disc 18 in which the recess portions 12a are formed in the lower layer 12 on the substrate 10 is formed.

In the recording original disc manufacturing process as described above, when the same material as the lower layer 12, for example, Al, Cr, $SiO_2$, Si, $Si_3N_4$, PMMA, PC or the like is used for the material of the substrate 10, the step for forming the lower layer 12 may be omitted because the recess portions corresponding to pits or grooves may be formed in the substrate 10 itself.

Here, suitable combinations between the etching gas (first etchant) used in the RIE treatment (the etching of the third step: first etching) of FIG. 5F, the etching gas (second etchant) used in the RIE treatment (the etching of the fourth step: second etching) of FIG. 5H, the etching gas or etching liquid (third etchant) used in the etching treatment (the etching of the fifth step: third etching) of FIG. 5I, the first etching-applied material constituting the lower layer 12 and the second etching-applied material constituting the intermediate layer 14 are shown in the following tables 1 to 4.

TABLE 1

Substrate (10):

$SiO_2$, Si, Al, Cr, Ni, Chemically strengthend glass, Stainless steel

Intermediate layer (14):

$SiO_2$

Etchant used in the first etching process:

$C_2F_6$, $C_3F_8$, $C_4F_{10}$, $CHF_3$, $CF_4 + H_2$, $CF_4 + C_2H_2$

Upper layer (16):

Orthodiazonaphthoquinone group photoresist (e.g. OFPR800, AZ1350J)

1) Lower layer (12): Si
    Etchant used in the second etching process:
        $CF_4 + O_2$ (4%), $CCl_4 + Cl_2$, $SiCl_4$, $BCl_3$, $CF_3Cl$
    Etchant used in the third etching process:
        Dry/ $CF_4 + C_2H_2$, $CF_4 + H_2$ 2) Lower layer (12): $Si_3N_4$
    Etchant used in the second etching process:
        $CF_4 + O_2$, $CF_4 + N_2$, $SiF_4$, $C_2F_8$, $CF_2H_2$, $CFH_3$, $NF_3 + Cl_2$, $CF_4 + O_2 + C_2H_5OH$
    Etchant used in the third etching process:
        Dry/ $CF_4 + H_2$, $CHF_3$ 3) Lower layer (12): Cr
    Etchant used in the second etching process:
        $CCl_4 + O_2$, $Cl_2 + $ Air
    Etchant used in the third etching process:
        Dry/ HF, $C_2F_6$, $C_3F_8$, $C_4F_{10}$, $CF_4 + H_2$, $CF_4 + C_2H_2$ 4) Lower layer (12): Al
    Etchant used in the second etching process:
        $CCl_4+$ He/Ar, $CCl_4 + Cl_2$, $BCl_3 + O_2/Cl_2$, $BCl_3$, $SiCl_4$
    Etchant used in the third etching process:
        Wet/ HF:$NH_4F$(1:6)

Table 2

TABLE 2

Substrate (10):

$SiO_2$, Si, Al, Cr, Ni, Chemically strengthened glass, Stainless steel

Intermediate layer (14):

$Si_3N_4$

Etchant used in the first etching process:

$CF_4 + O_2$, $CF_4 + N_2$, $SiF_4$, $C_2F_6$, $CF_2H_2$, $CFH_3$, $NF_3 + Cl_2$, $CF_4 + O_2 + C_2H_5OH$

Upper layer (16):

Orthodiazonaphthoquinone group photoresist (e.g. OFPR800, AZ1350J)

1) Lower layer (12): Si
    Etchant used in the second etching process:
        $CF_4 + O_2$ (4%), $SiCl_4$
    Etchant used in the third etching process:
        Dry/ $C_2F_6$, $CH_2F_2$ 2) Lower layer (12): $SiO_2$
    Etchant used in the second etching process:
        $CCl_4$, $CF_4 + H_2$, $CHF_3$
    Etchant used in the third etching process:
        Dry/ $CF_4 + O_2$ (4%), $SiF_4$, $CHF_3$, $NF_3 + Cl_2$, $CF_4 + O_2$ (4%) $+ C_2H_5OH$, $CF_4 + N_2$, $C_2H_6$, $CH_2F_2$ 3) Lower layer (12): Cr
    Etchant used in the second etching process:
        $CCl_4 + O_2$, $Cl_2 + $ Air
    Etchant used in the third etching process:
        Dry/ $CF_4 + O_2$, $CF_4 + N_2$, $SiF_4$, $C_2F_6$, $CF_2H_2$, $CFH_3$, $NF_3 + Cl_2$, $CF_4 + O_2 + C_2H_5OH$

TABLE 2-continued

4) Lower layer (12): Al
   Etchant used in the second etching process:
   $SiCl_4$
   Etchant used in the third etching process:
   Dry/ $CF_4 + O_2$, $CF_4 + N_2$, $SiF_4$, $C_2F_6$, $CF_2H_2$, $CFH_3$, $NF_3 + Cl_2$, $CF_4 + O_2 + C_2H_5OH$ Table 3

TABLE 3

Substrate (10):

$SiO_2$, Si, Al, Cr, Ni, Chemically strengthened glass, Stainless steel

Intermediate layer (14):

Si
Etchant used in the first etching process:
$CCl_4$, $CCl_2F_2$, $CClF_3$, $SF_6$, $C_2F_6 + Cl_2$, $CBrF_3$, $CCl_4 + Cl_2$, $CF_4 + O_2$ (4%), $C_2F_6 + CF_3Cl(1:1)$ (4:1)

Upper layer (16):

Orthodiazonaphthoquinone group photoresist (e.g. OFPR800, AZ1350J)

1) Lower layer (12): $SiO_2$
   Etchant used in the second etching process:
   $C_2F_6$, $CF_4$, $CF_4 + C_2H_4$, $CF_4 + H_2$, $CH_2F_2$
   Etchant used in the third etching process:
   Dry/ $CF_4 + O_2$ (4%), $CCl_4 + Cl_2$, $CF_3Cl$, $C_2F_6 + CF_3Cl$, $C_2F_6 + Cl_2$ 2) Lower layer (12): $Si_3N_4$
   Etchant used in the second etching process:
   $C_2F_6$, $CH_2F_2$
   Etchant used in the third etching process:
   Dry/ $CF_4 + O_2$ (4%)

Table 4

TABLE 4

Substrate (10):

$SiO_2$, Si, Al, Cr, Ni, Chemically strengthened glass, Stainless steel

Lower layer (12):

Polyvinyl cinnamate, mixture of polyvinyl phenol and aromatic bisazide, mixture of alkali soluble phenol resin and naphthoquinone diazide, polymethylmethacrylate (PMMA), mixture of diazomerdrum acid and novolak, compound of cresol novolak and naphthoquinone diazide, polyhexafluorobutylmethacrylate (FBM), polybutenesulfone (PBS), chloromethylated polystyrene (CMS), polycarbonate (PC), amorphous polyolefine (APO), epoxy resin
Etchant used in the second etching process:
$O_2$, $O_2 + CH_4$, $Ar + CH_4$, $N_2$ Upper layer (16):
Orthodiazonaphthoquinone group photoresist (e.g. OFPR800, AZ1350J)

1) Intermediate layer (14): Si
   Etchant used in the first etching process:
   $CCl_4$, $CCl_2F_2$, $CClF_3$, $SF_6$, $C_2F_6 + Cl_2$, $CBrF_3$, $CCl_4 + Cl_2$, $CF_4 + O_2$ (4%), $C_2F_6 + CF_3Cl(1:1)$ (4:1)
   Etchant used in the third etching process:
   Dry/ $CF_4 + H_2$
   Wet/ $HF:NH_4F(1:6)$ 2) Intermediate layer (14): $SiO_2$
   Etchant used in the first etching process:
   $C_2F_6$, $C_3F_8$, $C_4F_{10}$, $CHF_3$, $CF_4 + H_2$, $CF_4 + C_2H_2$, $CF_4 + O_2$ (4%)
   Etchant used in the third etching process:
   Wet/ $HF:NH_4F(1:6)$

TABLE 4-continued

3) Intermediate layer (14): $Si_3N_4$
   Etchant used in the first etching process:
   $CF_4 + O_2$, $CF_4 + N_2$, $SiF_4$, $C_2F_6$, $CF_2H_2$, $CHF_3$, $NF_3 + Cl_2$, $CF_4 + O_2 + C_2H_5OH$
   Etchant used in the third etching process:
   Wet/ $HF + CH_3COOH$ According to the combinations shown in the tables 1 to 4, in the second etching, the lower layer 12 can be etched at an excellent etching selection ratio with using the intermediate layer 14 as a mask to form recess portions 12a in which the top opening width and the bottom opening width are substantially equal to each other. Further, in the third etching, the intermediate layer 14 can be etched and removed at an excellent etching selection ratio without removing the lower layer 12.

In the recording original disc manufacturing process as described above, three cases in which the etching selection ratio of the intermediate layer 14 to the upper layer 16 is different are shown in FIGS. 6A and 6B, FIGS. 7A and 7B and FIGS. 8A and 8B.

Figure 6A:
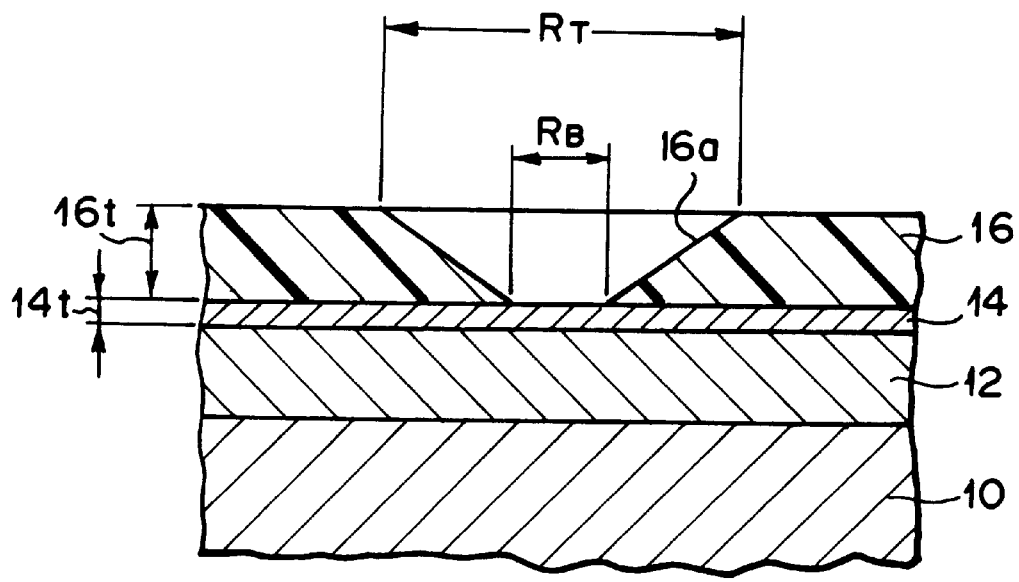
FIGS. 6A and 6B and FIGS. 7A and 7B and FIGS. 8A and 8B are diagrams when the etching selection ratio of the intermediate layer to the upper layer is varied in the manufacturing method for the recording original disc.
Figure 6B:
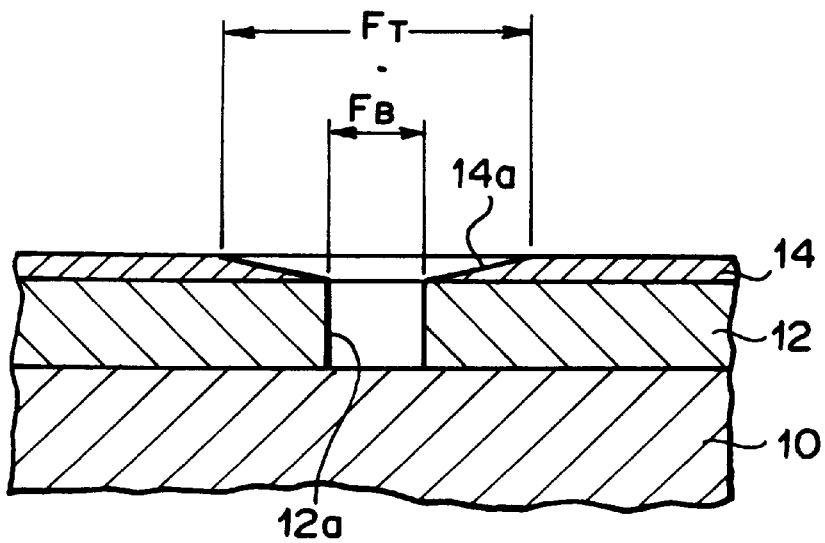

FIGS. 6A and 6B show a case where the selection ratio of the intermediate layer 14/the upper layer 16 is equal to 0.1. FIG. 6A corresponds to the status of FIG. 5D, and FIG. 6B corresponds to the status of FIG. 5G. If the thickness 16t of the upper layer 16 is equal to 100 nm, the thickness 14t of the intermediate layer 14 may be below 1/10 of the thickness 16t, that is, below 10 nm. With this condition, the bottom opening width RB of the opening portion 16a of the upper layer 16 and the bottom opening width $F_B$ of the opening portion 14a of the intermediate layer 14 can be made substantially equal to each other. If the thickness 14t is set to be larger than 10 nm, the upper layer 16 is extinguished before the opening portion 14a has been formed, and thus this condition is not preferable.

Figure 7A:
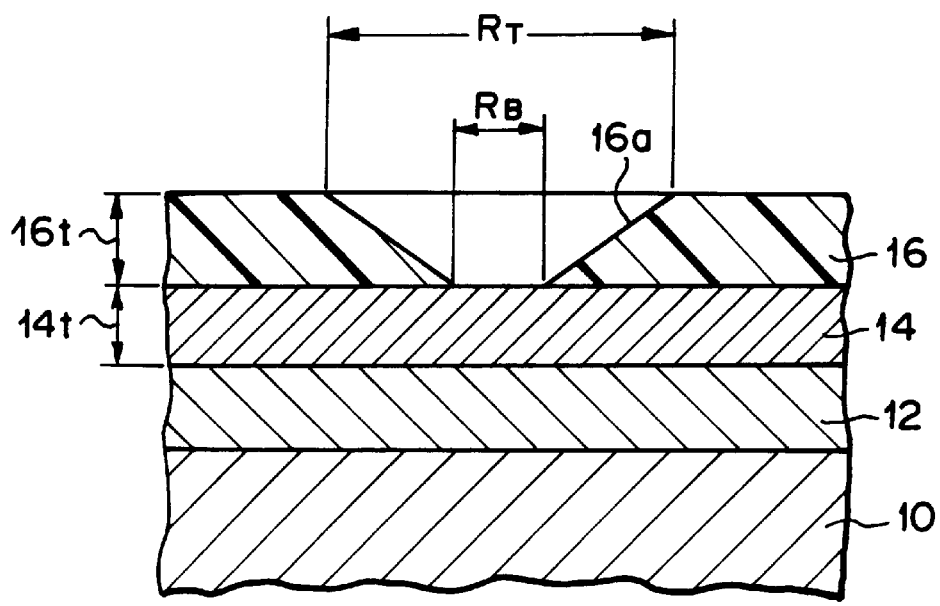
Figure 7B:
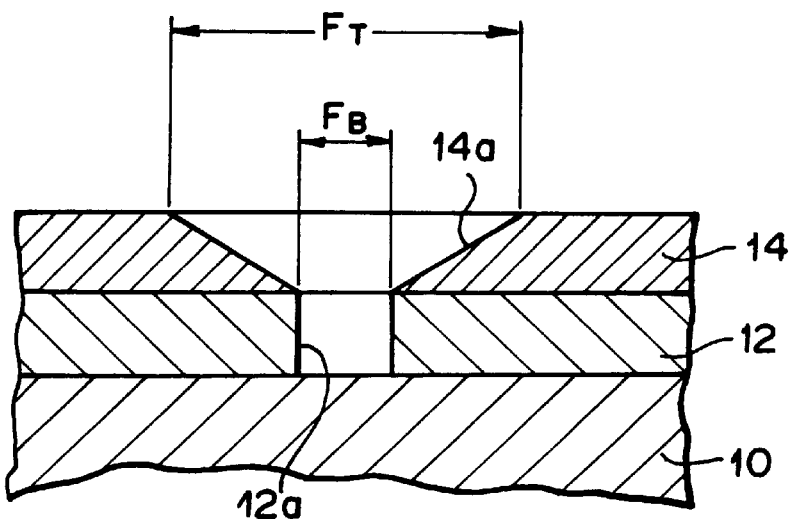

FIGS. 7A and 7B show a case where the selection ratio of the intermediate layer 14/the upper layer 16 is equal to 1. FIG. 7A corresponds to the status of FIG. 5D, and FIG. 7B corresponds to the status of FIG. 5G. If the thickness 16t of the upper layer 16 is equal to 100 nm, the thickness 14t of the intermediate layer 14 may be below 1/1 of the thickness 16t, that is, below 100 nm. With this condition, the bottom opening width $R_E$ of the opening portion 16a of the upper layer 16 and the bottom opening width $F_B$ of the opening portion 14a of the intermediate layer 14 can be made substantially equal to each other. If the thickness 14t is set to be larger than 100 nm, the upper layer 16 would be extinguished before the opening portion 14a has been formed, and thus this condition is not preferable.

Figure 8A:
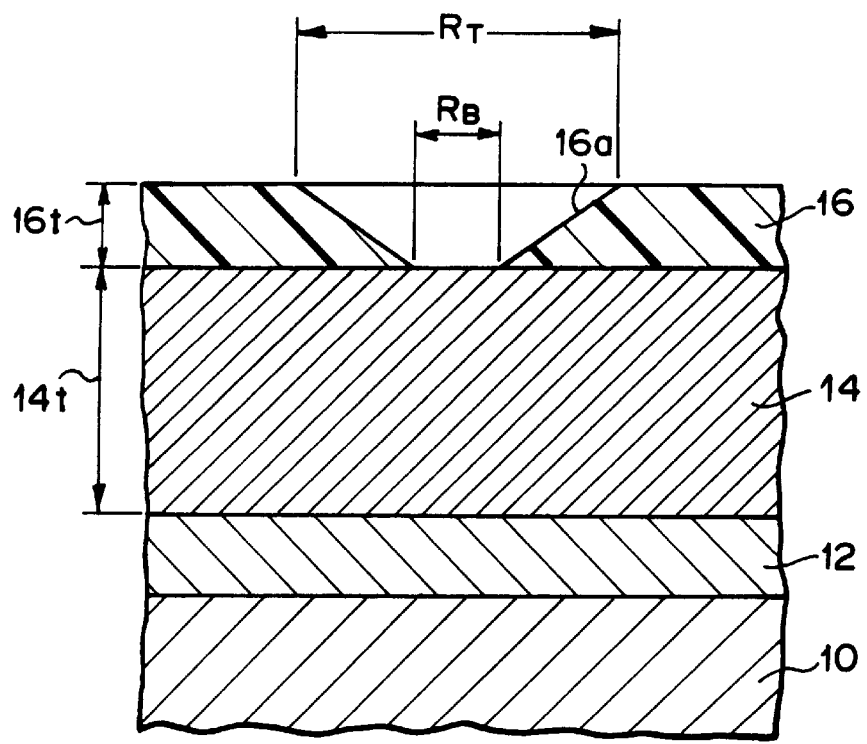
Figure 8B:
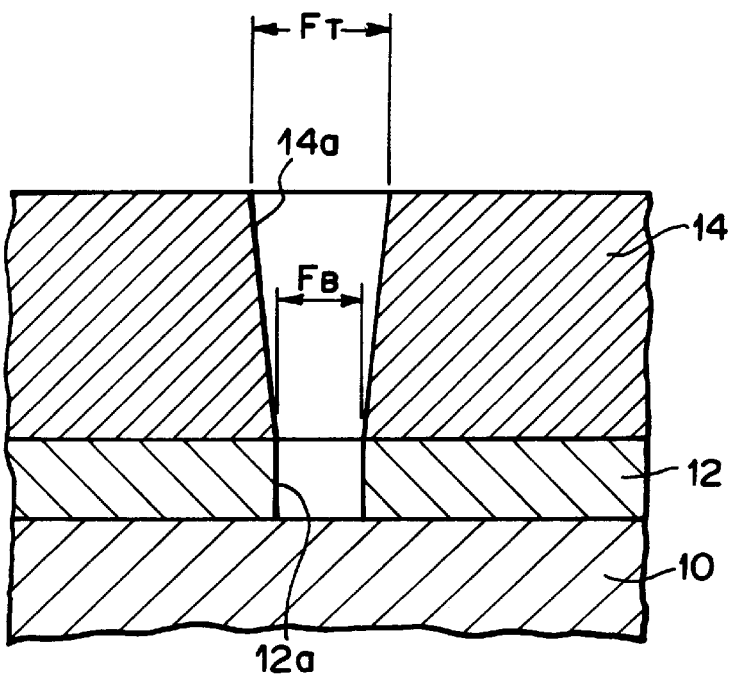

FIGS. 8A and 8B show a case where the selection ratio of the intermediate layer 14/the upper layer 16 is equal to 5. FIG. 8A corresponds to the status of FIG. 5D, and FIG. 8B corresponds to the status of FIG. 5G. If the thickness 16t of the upper layer 16 is equal to 100 nm, the thickness 14t of the intermediate layer 14 may be below 5/1 of the thickness 16t, that is, below 500 nm. In the case of FIGS. 8A and 8B, the thickness 14t is set to 300 nm. With this condition, the bottom opening width $R_B$ of the opening portion 16a of the upper layer 16 and the bottom opening width $F_B$ of the opening portion 14a of the intermediate layer 14 can be made substantially equal to each other. If the thickness 14t is set to be larger than 500 nm, the upper layer 16 would be extinguished before the opening portion 14a has been formed, and thus this condition is not preferable.

As is apparent from the description with reference to FIGS. 6A to 8B, it is sufficient to satisfy D≦(d×n) where the thickness 14t of the intermediate layer 14 is represented by D, the thickness 16t of the upper layer 16 is represented by d and the selection ratio of the intermediate layer 14/the upper layer 16 is represented by n. Accordingly, even when the selection ratio of the intermediate layer 14 to the upper layer 16 is equal to 1 or less, the intermediate layer 14 can be used as a mask to etch the lower layer. Further, when the selection ratio of the intermediate layer 14 to the upper layer 16 is larger than 1, the thickness of the intermediate layer 14 can be set to be larger than the thickness of the upper layer 16. Therefore, even when the selection ratio of the lower layer 12 to the intermediate layer 14 in the etching process of the lower layer 12 is relatively small, the intermediate layer 14 can be used as a mask. Accordingly, the selection of the first etching-applied material and the second etching-applied material which are used for the lower layer 12 and the intermediate layer 14 can be broadened.

Figure 9A:
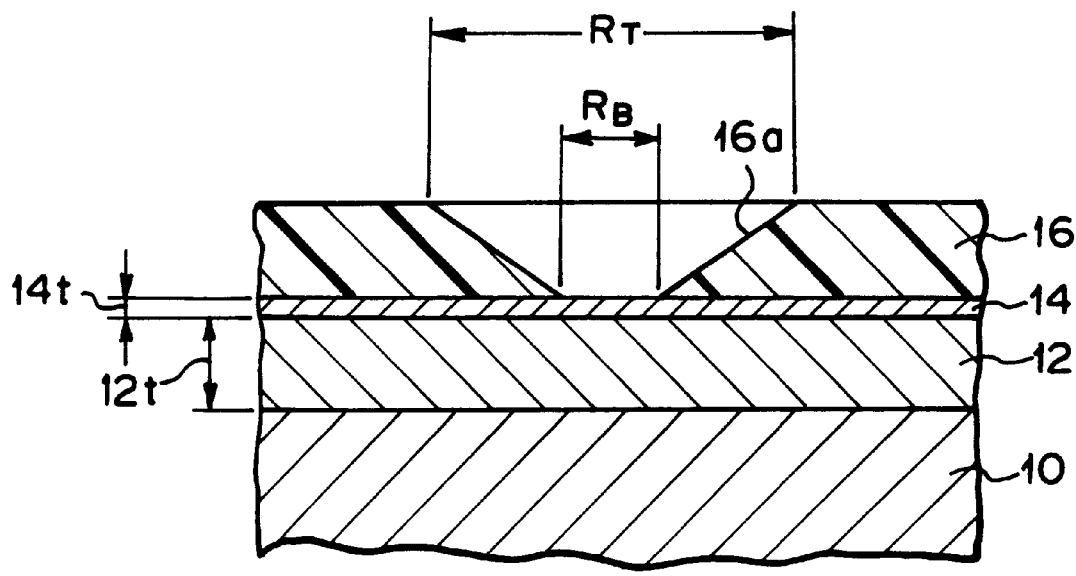
FIGS. 9A and 9B are diagrams showing a case where the thickness of the intermediate layer is sufficiently smaller than that of the lower layer in the manufacturing method for the recording original disc according to the present invention.
Figure 9B:
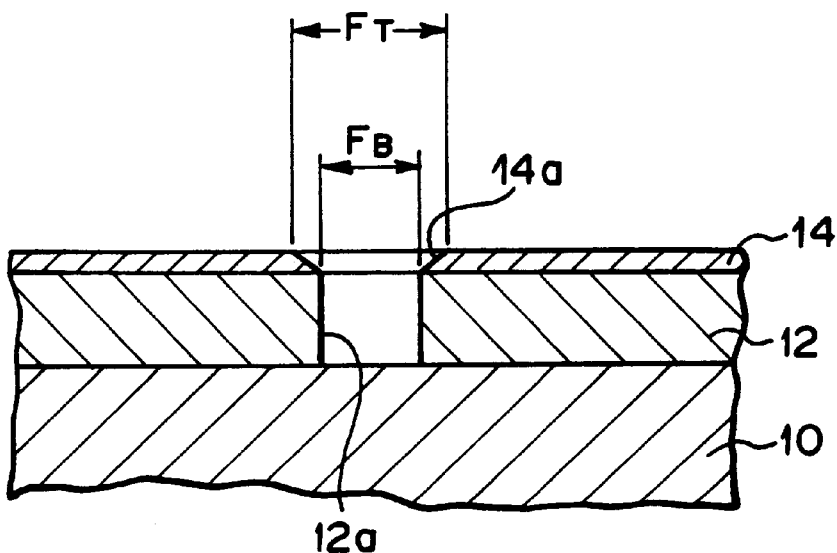

As shown in FIGS. 9A and 9B, if the thickness 14t of the intermediate layer 14 is below 1/10 of the thickness 12t of the lower layer 12 (the thickness 12t corresponds to the depth of the information pits), pits of smaller width ($F_T \approx F_B$) than the diameter of spots ($R_T$) determined by an optical system can be formed even when the selection ratio of the upper layer 16 to the intermediate layer 14 is equal to about 1.

Next, it will be described that when the etching gas or etching liquid such as described in the tables 1 to 4 and the other etching gas or etching liquid are used, the lower layer 12 can be etched with using the intermediate layer 14 as a mask in the RIE treatment of FIG. 5H and the intermediate layer 14 can be etched and removed with hardly removing the lower layer 12 in the etching treatment of FIG. 5I by using a combination of the etching-applied materials such as described in the tables 1 to 4 and the other etching-applied materials for the lower layer 12 and the intermediated layer 14.

(a) When $CF_4$, $CF_4+H_2$, $CF_4+C_2H_2$, $CF_4+CHF_3$, $CHF_3$ or the like is used as etching gas, the etching selection ratio of $SiO_2/Si$ can be set to 10 or more because the etching rate of $SiO_2$ can be set to be extremely larger than that of Si. This is described in "THIN FILM HANDBOOK" written by Masahide Kamiyama, issued by Ohm Co., Ltd. in 1983, pp 296–298 (hereinafter referred to as "Document 1"), "PLASMA MATERIAL SCIENCE HANDBOOK" written by Kazuo Akashi, issued by Ohm Co., Ltd. in 1992, pp 468–476 (hereinafter referred to as "Document 2"), N. Ikegami, N. Ozawa, Y. Miyakawa and J. Kanamori, "Reactions of radicals with silicon oxide surfaces in a fluorocarbon plasma", Proceeding of Symposium on Dry Process, 83 (1990). Accordingly, the lower layer 12 can be etched with using the intermediate layer 14 as a mask by using Si for the intermediate layer 14, $SiO_2$ for the lower layer 12 and the above-described etching gas in the second etching process.

Further, the intermediate layer 14 can be etched and removed with hardly etching the lower layer 12 by using $SiO_2$ for the intermediate layer 14, Si for the lower layer 12 and the above-described etching gas in the third etching process.

(b) When $NF_3+O_2$, $NF_3+NH_3$, $SF_6$, $Cl_2$, $CCl_4$, $CCl_4+O_2$ or the like is used as the etching gas, the etching selection ratio of $Si/SiO_2$ can be set to 10 or more because the etching rate of Si can be set to be extremely larger than that of $SiO_2$. This is described in the Document 2, and by T. Akimoto, K. Kasama and M. Sakamoto, "Removal of RIE induced damage layer using $NF_3/O_2$ chemical dry etching", Proceeding of Symposium on Dry Process, 92 (1988), H. Nishino, N. Hayasaka, H. Ito, T. Arikado and H. Okano, "Damage-free selective etching of Si native oxide employing fluorine atoms and nitrogen hydrides produced by $NH_3+NF_3$ microwave discharge", Proceeding of Symposium on Dry Process, 90 (1989), and S. Noda, H. Kinoshita, S. Nishikawa and S. Ohno, "Magnetron etching of quarter micron $n^+$-poly Si gates", Proceeding of Symposium on Dry Process, 27 (1988). Accordingly, the lower layer 12 can be etched with using the intermediate layer 14 as a mask by using $SiO_2$ for the intermediate layer 14, Si for the lower layer 12, and the above-described etching gas in the second etching.

Further, the intermediate layer 14 can be etched with hardly etching the lower layer 12 by using Si for the intermediate layer 14, $SiO_2$ for the lower layer 12 and the above-described etching gas in the third etching process.

(c) When $CF_4+O_2$, $CF_4+O_2+C_2H_5OH$, $Cl_2+NF_3$ or the like is used as the etching gas, the etching selection ratio of $Si_3N_4/SiO_2$ can be set to 10 or more because the etching rate of $Si_3N_4$ can be set to be extremely larger than that of $SiO_2$. This is described in the Document 2. Accordingly, the lower layer 12 can be etched with using the intermediate layer 14 as a mask by using $SiO_2$ for the intermediate layer 14, $Si_3N_4$ for the lower layer 12 and the above-described etching gas in the second etching process.

Further, the intermediate layer 14 can be etched and removed with hardly etching the lower layer 12 by using $Si_3N_4$ for the intermediate layer 14, $SiO_2$ for the lower layer 12 and the above-described etching gas in the third etching process.

(d) When $CH_2F_2$, $C_2F_6$ or the like is used as the etching gas, the etching selection ratio of $Si_3N_4/(SiO_2$ or Si) can be set to 10 or more because the etching rate of $Si_3N_4$ can be set to be extremely larger than that of $SiO_2$ or Si. This is described in the Documents 1 and 2. Accordingly, the lower layer 12 can be etched with using the intermediate layer 14 as a mask by using $SiO_2$ or Si for the intermediate layer 14, $Si_3N_4$ for the lower layer 12 and the above-described etching gas in the second etching process.

Further, the intermediate layer 14 can be etched and removed with hardly etching the lower layer 12 by using $Si_3N_4$ for the intermediate layer 14, $SiO_2$ or Si for the lower layer 12 and the above-described etching gas in the third etching process.

(e) When $BCl_3$, $CCl_4+Cl_2$ or the like is used as the etching gas, the etching selection ratio of $Al/(SiO_2$ or Si) can be set to 10 or more because the etching rate of Al can be set to be extremely larger than that of $SiO_2$ or Si. This is described in the Document 1. Accordingly, the lower layer 12 can be etched with using the inter-mediate layer 14 as a mask by using $SiO_2$ or Si for the intermediate layer 14, Al for the lower layer 12 and the above-described etching gas in the second etching process.

Further, the intermediate layer 14 can be etched and removed with hardly etching the lower layer 12 by using Al for the inter-mediate layer 14, $SiO_2$ or Si for the lower layer 12 and the above-described etching gas in the third etching process.

(f) When $BCl_3+Cl_2$ or the like is used as the etching gas, the etching selection ratio of $Al/SiO_2$ can be set to 10 or more because the etching rate of Al can be set to be extremely larger than that of $SiO_2$. This is described by N. Jiwari, H. Iwasawa, A. Narai, H. Sakaue, H. Shindo, T. Shoji and Y. Horiike in "Al etching characteristics employing Helen wave plasma", Proceeding of Symposium on Dry Process, 23 (1992). Accordingly, the lower layer 12 can be etched with using the intermediate layer 14 as a mask by using $SiO_2$ for the intermediate layer 14, Al for the lower layer 12 and the above-described etching gas in the second etching process.

Further, the intermediate layer 14 can be etched and removed with hardly etching the lower layer 12 by using Al for the intermediate layer 14, $SiO_2$ for the lower layer 12 and the above-described etching gas in the third etching process.

(g) When $SiCl_4$ or the like is used as the etching gas, the etching selection ratio of Al/(Si, $SiO_2$ or $Si_3N_4$) can be set to 10 or more because the etching rate of Al can be set to be extremely larger than that of Si, $SiO_2$ or $Si_3N_4$. This is described in the Document 1. Accordingly, the lower layer 12 can be etched with the intermediate layer 14 used as a mask by using Si, $SiO_2$ or $Si_3N_4$ for the intermediate layer 14, Al for the lower layer 12 and the above-described etching gas in the second etching process.

Further, the intermediate layer 14 can be etched and removed with hardly etching the lower layer 12 by using Al for the intermediate layer 14, Si, $SiO_2$ or $Si_3N_4$ for the lower layer 12 and the above-described etching gas in the third etching process.

(h) When $Cl_2$, $SiCl_4$ or the like is used as the etching gas, the etching selection ratio of $AlSiCu/SiO_2$ can be set to 10 or more because the etching rate of AlSiCu can be set to be extremely larger than that of $SiO_2$. This is described in M. Sato and Y. Arita, "Al—Cu alloy etching using aluminum chloride source", Proceeding of Symposium on Dry Process, 59 (1992). Accordingly, the lower layer 12 can be etched with the intermediate layer 14 used as a mask by using $SiO_2$ for the intermediate layer 14, AlSiCu for the lower layer 12 and the above-described etching gas in the second etching process.

Further, the intermediate layer 14 can be etched and removed with hardly etching the lower layer 12 by using AlSiCu for the intermediate layer 14, $SiO_2$ for the lower layer 12 and the above-described etching gas in the third etching process.

(i) When $CCl_4$ or the like is used as the etching gas, the etching selection ratio of AlSi/Si can be set to 10 or more because the etching rate of AlSi can be set to be extremely larger than that of Si. This is described in the Document 1. Accordingly, the lower layer 12 can be etched with the intermediate layer 14 used as a mask by using Si for the intermediate layer 14, AlSi for the lower layer 12 and the above-described etching gas in the second etching process.

Further, the intermediate layer 14 can be etched and removed with hardly etching the lower layer 12 by using AlSi for the intermediate layer 14, Si for the lower layer 12 and the above-described etching gas in the third etching process.

FIGS. 10A to 10H show a series of processes of a method of manufacturing an optical disc by using the recording original disc which is manufactured in the manner as described above.

Figure 10A:
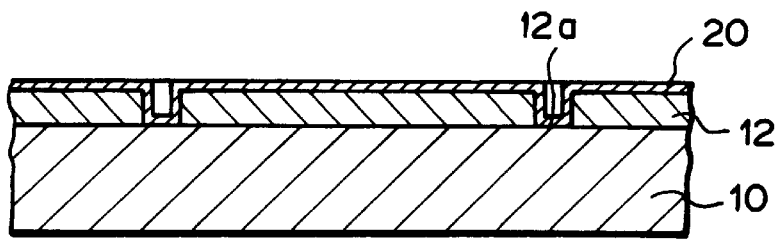
FIGS. 10A to 10H are cross-sectional views showing a series of steps for manufacturing an optical disc by using the recording original disc which is formed according to the method of the present invention.

First, a Ni plating thin film 20 is formed on the upper surface of the recording original disc, that is, on the upper surface of the lower layer 12 and also on the inner surfaces of the recess portions 12a as shown in FIG. 10A. The Ni plating thin film 20 is provided to facilitate exfoliation of a metal master from the recording original disc in a subsequent step.

Figure 10B:
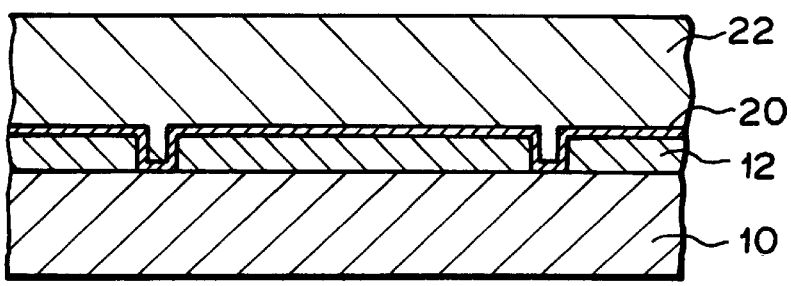

Subsequently, a Ni plating layer 22 is formed on the Ni plating thin film 20 by an electroplating or electroless plating method as shown in FIG. 10B.

Figure 10C:
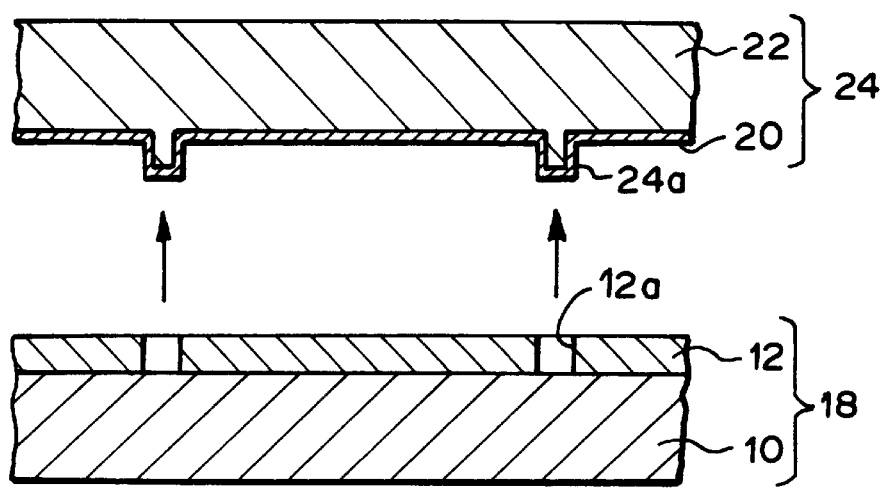

Subsequently, both the Ni plating thin film 20 and the Ni plating layer 22 are exfoliated from the recording original disc 18 as shown in FIG. 10C to form a metal master 24. On the lower surface of the metal master 24 is formed projections 24a having the shape which is copied from that of the recess portions 12a.

Figure 10D:
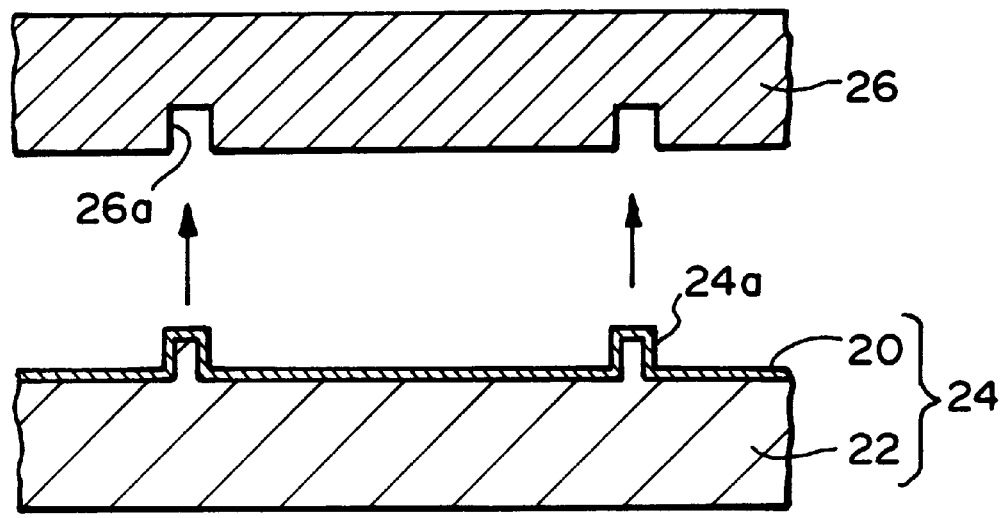

Subsequently, a mother 26 is formed by using the metal master 24 as shown in FIG. 10D. Consequently, the mother 26 is formed with recess portions 26a having the shape which is copied from that of the projections 24a of the metal master 24.

Figure 10E:
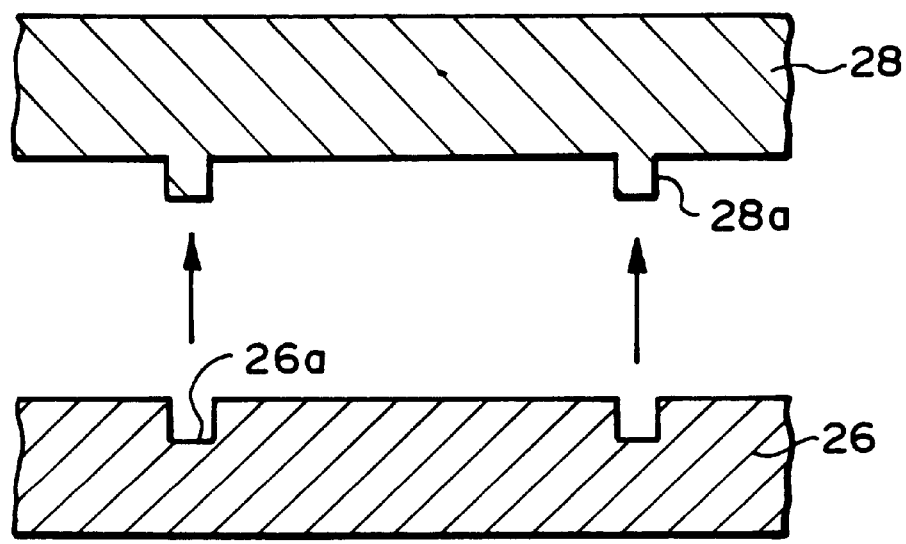

Subsequently, a stamper 28 is formed by using the mother 26 as shown in FIG. 10E. Consequently, the stamper 28 is formed with projections 28a having the shape which is copied from that of the recess portions 26a of the mother 26.

Figure 10F:
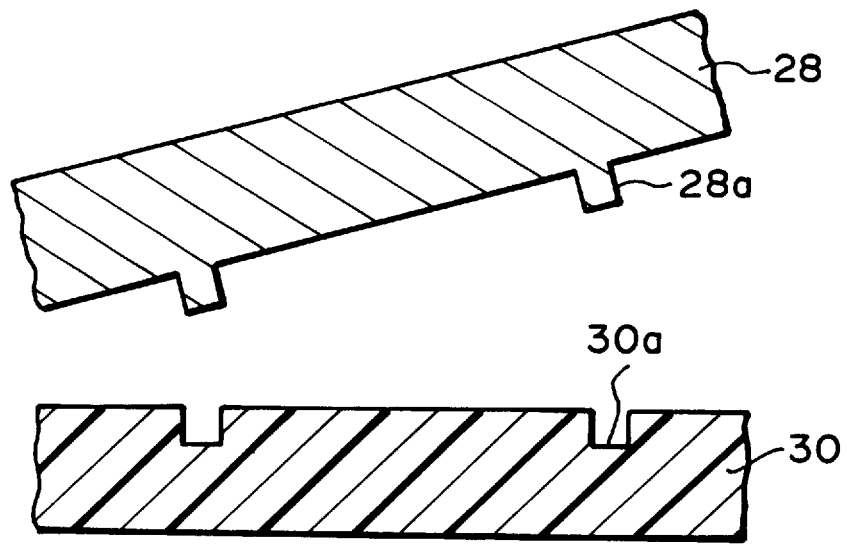
Figure 10G:
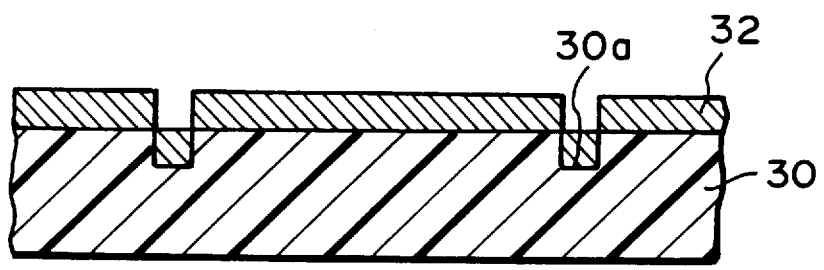

Subsequently, an optical disc substrate 30 is formed by pressing PMMA or PC resin with the stamper 28 as shown in FIG. 10F. Consequently, the optical disc substrate 30 is formed with recess portions 30a having the shape which is copied from that of the projections 28a of the stamper 28. The recess portions 30a thus formed correspond to recording information pits or grooves.

Subsequently, a reflection film 32 made of metal such as aluminum or the like is formed on the whole surface of the optical disc substrate 30 at the recess portion 30a side.

Figure 10H:
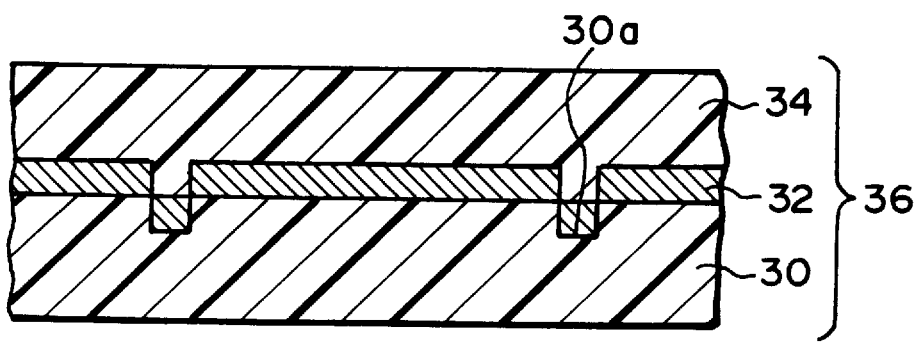

Finally, a protection film of resin 34 or the like is formed on the metal reflection film 32 as shown in FIG. 10H to form an optical disc 36.

The recess portions 30a of the optical disc 36 thus obtained are directly reflected by the shape of the recess portions 12a of the recording original disc 18, so that the side walls are designed to be substantially perpendicular to the optical disc substrate 30 without being oblique to the substrate. Accordingly, the size of the information pits can be sufficiently small, and the recording density of the optical disc can be enhanced.

As described above, when the removing step of the intermediate layer 14 is omitted because the thickness of the intermediate layer 14 is equal to or less than the half of the thickness of the lower layer 12, that is, the depth of the recess portions 30a of the optical disc 36, the plating thin film 20 is formed on the residual intermediate layer in the step of FIG. 10A.

What is claimed is:

1. A method of manufacturing a recording original disc for optical information recording media comprising the steps of:

forming a lower layer of a first etching-applied material onto a surface of a substrate, the first etching-applied material being one of Si, $Si_3N_4$, Cr and Al;

forming an intermediate layer of a second etching-applied material on said lower layer, the second etching-applied material being $SiO_2$;

forming an upper layer of positive type photoresist on said intermediate layer;

exposing said upper layer of positive type photoresist to light to form a pattern corresponding to recording information, a shape of a latent image being formed on said upper layer, and first side walls defining said image in said upper layer being slanted with respect to a vertical axis of said disc, and decreasing in width in a direction from said upper layer towards said intermediate layer;

developing said upper layer of positive type photoresist to remove said latent image formed in said upper layer, thus forming a first opening portion in said upper layer having said slanted first side walls;

etching said intermediate layer while using as a mask said upper layer of positive type photoresist which has been exposed to light and developed, thus forming a second opening portion in said intermediate layer having second side walls, said second side walls being slanted from a perpendicular and decreasing in width in a direction from said intermediate layer towards said lower layer; and etching said lower layer while using as a mask said intermediate layer, thus forming a third opening portion in said lower layer, with side walls of said third opening portion being substantially perpendicular to said surface of said substrate, thus forming a recording original disc;

wherein a material used for said substrate and said first etching-applied material are the same material, and thus said substrate and said lower layer are formed simultaneously in a single step.

2. The method of manufacturing a recording original disc for optical information recording media according to claim 1, wherein etching of said intermediate layer and said lower layer is performed by reactive ion etching, and, an etching selection ratio of said lower layer to said intermediate layer during said etching of said lower layer is set to 10 or more.

3. The method of manufactuing a recording original disc for optical information recording media according to claim 1, wherein said lower layer has a thickness of 60 to 100 nm and said intermediate layer has a thickness of 20 to 150 nm.

4. A method of manufacturing a recording original disc for optical information recording media comprising the steps of:

forming a lower layer of a first etching-applied material onto a surface of a substrate, the first etching-applied material being one of Si, $SiO_2$, Cr, and Al;

forming an intermediate layer of a second etching-applied material on said lower layer, the second etching-applied material being $Si_3N_4$;

forming an upper layer of positive type photoresist on said intermediate layer;

exposing said upper layer of positive type photoresist to light to form a pattern corresponding to recording information, a shape of a latent image being formed on said upper layer, and first side walls defining said image in said upper layer being slanted with respect to a vertical axis of said disc, and decreasing in width in a direction from said upper layer towards said intermediate layer;

developing said upper layer of positive type photoresist to remove said latent image formed in said upper layer, thus forming a first opening portion in said upper layer having said slanted first side walls;

etching said intermediate layer while using as a mask said upper layer of positive type photoresist which has been exposed to light and developed, thus forming a second opening portion in said intermediate layer having second side walls, said second side walls being slanted from a perpendicular and decreasing in width in a direction from said intermediate layer towards said lower layer; and etching said lower layer while using as a mask said intermediate layer, thus forming a third opening portion in said lower layer, with side walls of said third opening portion being substantially perpendicular to said surface of said substrate, thus forming a recording original disc;

wherein a material used for said substrate and said first etching-applied material are the same material, and thus said substrate and said lower layer are formed simultaneously in a single step.

5. The method of manufacturing a recording original disc for optical information recording media according to claim 4, wherein etching of said intermediate layer and said lower layer is performed by reactive ion etching, and, an etching selection ratio of said lower layer to said intermediate layer during said etching of said lower layer is set to 10 or more.

6. The method of manufacturing a recording original disc for optical information recording media according to claim 4, wherein said lower layer has a thickness of 60 to 100 nm and said intermediate layer has a thickness of 20 to 150 nm.

7. A method of manufacturing a recording original disc for optical information recording media comprising the steps of:

forming a lower layer of a first etching-applied material onto a surface of a substrate, the first etching-applied material being one of $SiO_2$ and $Si_3N_4$;

forming an intermediate layer of a second etching-applied material on said lower layer, the second etching-applied material being Si;

forming an upper layer of positive type photoresist on said intermediate layer, exposing said upper layer of positive type photoresist to light to form a pattern corresponding to recording information, a shape of a latent image being formed on said upper layer, and first side walls defining said image in said upper layer being slanted with respect to a vertical axis of said disc, and decreasing in width in a direction from said upper layer towards said intermediate layer;

developing said upper layer of positive type photoresist to remove said latent image formed in said upper layer, thus forming a first opening portion in said upper layer having said slanted first side walls;

etching said intermediate layer while using as a mask said upper layer of positive type photoresist which has been exposed to light and developed, thus forming a second opening portion in said intermediate layer having second side walls, said second side walls being slanted from a perpendicular and decreasing in width in a direction from said intermediate layer towards said lower layer; and etching said lower layer while using as a mask said intermediate layer, thus forming a third opening portion in said lower layer, with side walls of said third opening portion being substantially perpendicular to said surface of said substrate, thus forming a recording original disc.

8. The method of manufacturing a recording original disc for optical information recording media according to claim 7, wherein etching of said intermediate layer and said lower layer is performed by reactive ion etching, and, an etching selection ratio of said lower layer to said intermediate layer during said etching of said lower layer is set to 10 or more.

9. The method of manufacturing a recording original disc for optical information recording media according to claim 7, wherein said lower layer has a thickness of 60 to 100 nm and said intermediate layer has a thickness of 20 to 150 nm.

10. The method of manufacturing a recording original disc for optical information recording media according to claim 7, wherein a material used for said substrate and said first etching-applied material are the same material, and thus said substrate and said lower layer are formed simultaneously in a single step.

11. A method of manufacturing a recording original disc for optical information recording media comprising the steps of:

forming a lower layer of a first etching-applied material onto a surface of a substrate, the first etching-applied material being an organic material;

forming an intermediate layer of a second etching-applied material on said lower layer, the second etching-applied material being one of Si, $SiO_2$ and $Si_3N_4$;

forming an upper layer of positive type photoresist on said intermediate layer;

exposing said upper layer of positive type photoresist to light to form a pattern corresponding to recording information, a shape of a latent image being formed on said upper layer, and first side walls defining said Image in said upper layer being slanted with respect to a vertical axis of said disc, and decreasing in width in a direction from said upper layer towards said intermediate layer;

developing said upper layer of positive type photoresist to remove said latent image formed in said upper layer, thus forming a first opening portion in said upper layer having said slanted first side walls;

etching said intermediate layer while using as a mask said upper layer of positive type photoresist which has been exposed to light and developed, thus forming a second opening portion in said intermediate layer having second side walls, said second side walls being slanted from a perpendicular and decreasing in width in a direction from said intermediate layer towards said lower layer; and etching said lower layer while using as a mask said intermediate layer, thus forming a third opening portion in said lower layer, with side walls of said third opening portion being substantially perpendicular to said surface of said substrate, thus forming a recording original disc.

12. The method of manufacturing a recording original disc for optical information recording media according to claim 11, wherein etching of said intermediate layer and said lower layer is performed by reactive ion etching, and, an etching selection ratio of said lower layer to said intermediate layer during said etching of said lower layer is set to 10 or more.

13. The method of manufacturing a recording original disc for optical information recording media according to claim 11, wherein the first etching-applied material is one of polyvinyl cinnamate, a mixture of polyvinyl phenol and aromatic bisazide, a mixture of alkali soluble phenol resin and naphthoquinone diazide, polymethylmethacrylate, a compound of cresol novolak and naththoquinone diazide, polyhexafluorobutylmethacrylate, polybutenesulfone, chloromethylated polystyrene, polycarbonate, amorphous polyolefine, and epoxy resin.

14. A method of manufacturing a recording original disc for optical information recording media comprising the steps of:

forming a lower layer of a first etching-applied material onto a surface of a substantially flat substrate, the first etching-applied material being one of Si, $Si_3N_4$, Cr and Al;

forming an intermediate layer of a second etching-applied material on said lower layer, the second etching-applied material being $SiO_2$;

forming an upper layer of positive type photoresist on said intermediate layer;

exposing said upper layer of positive type photoresist to light to form a pattern corresponding to recording information, a shape of a latent image which is formed on said upper layer of positive type photoresist by said exposure being a substantially Gaussian distribution which causes first side walls of said upper layer of positive type photoresist to be slanted with respect to a vertical axis of said disc, and decreasing in width in a direction from said upper layer of positive type photoresist towards said intermediate layer;

developing said upper layer of positive type photoresist to remove said latent image formed in said upper layer of positive type photoresist, thus forming a first opening portion in said upper layer of positive type photoresist having said slanted first side walls;

wherein in said exposure and development steps of said upper layer of positive type photoresist, said intermediate layer remains unchanged when exposed to said light and said development;

exposing said upper layer of positive type photoresist having said first opening portion to far ultraviolet radiation, said upper layer of positive type photoresist being subsequently subjected to heat treatment;

etching said intermediate layer using reactive ion etching while using as a mask said upper layer of positive type photoresist which has been exposed to light and developed, thus forming a second opening portion in said intermediate layer having second side walls, said second side walls being slanted from a perpendicular and decreasing in width in a direction from said intermediate layer towards said lower layer;

removing any residual upper layer of positive type photoresist left after said reactive ion etching using an ashing treatment using oxygen plasma; and etching said lower layer by reactive ion etching while using as a mask said intermediate layer, thus forming a third opening portion in said lower layer, with side walls of said third opening portion being substantially perpendicular to said surface of said substrate, thus forming a recording original disc;

wherein a material used for said substrate and said first ethcing-applied material are the same material, and thus said substrate and said lower layer are formed simultaneously in a single step.

15. The method of manufacturing a recording original disc for optical information recording media according to claim 14, wherein an etching selection ratio of said lower layer to said intermediate layer during said etching of said lower layer is set to 10 or more.

16. The method of manufacturing a recording original disc for optical information recording media according to claim 14, wherein said lower layer has a thickness of 60 to 100 nm and said intermediate layer has a thickness of 20 to 150 nm.

17. A method of manufacturing a recording original disc for optical information recording media comprising the steps of:

forming a lower layer of a first etching-applied material onto a surface of a substantially flat substrate, the first etching-applied material being one of Si, $SiO_2$, Cr and Al;

forming an intermediate layer of a second etching-applied material on said lower layer, the second etching-applied material being $Si_3N_4$;

forming an upper layer of positive type photoresist on said intermediate layer;

exposing said upper layer of positive type photoresist to light to form a pattern corresponding to recording information, a shape of a latent image which is formed on said upper layer of positive type photoresist by said exposure being a substantially Gaussian distribution which causes first side walls of said upper layer of positive type photoresist to be slanted with respect to a vertical axis of said disc, and decreasing in width in a direction from said upper layer of positive type photoresist towards said intermediate layer;

developing said upper layer of positive type photoresist to remove said latent image formed in said upper layer of positive type photoresist, thus forming a first opening portion in said upper layer of positive type photoresist having said slanted first side walls;

wherein in said exposure and development steps of said upper layer of positive type photoresist, said intermediate layer remains unchanged when exposed to said light and said development;

exposing said upper layer of positive type photoresist having said first opening portion to far ultraviolet radiation, said upper layer of positive type photoresist being subsequently subjected to heat treatment;

etching said intermediate layer using reactive ion etching while using as a mask said upper layer of positive type photoresist which has been exposed to light and developed, thus forming a second opening portion in said intermediate layer having second side walls, said second side walls being slanted from a perpendicular and decreasing in width in a direction from said intermediate layer towards said lower layer;

removing any residual upper layer of positive type photoresist left after said reactive ion etching using an ashing treatment using oxygen plasma; and etching said lower layer by reactive ion etching while using as a mask said intermediate layer, thus forming a third opening portion in said lower layer, with side walls of said third opening portion being substantially perpendicular to said surface of said substrate, thus forming a recording original disc;

wherein a material used for said substrate and said first etching-applied material are the same material, and thus said substrate and said lower layer are formed simultaneously in a single step.

18. The method of manufacturing a recording original disc for optical information recording media according to claim 17, wherein an etching selection ration of said lower layer to said intermediate layer during said etching of said lower layer is set to 10 or more.

19. The method of manufacturing a recording original disc for optical information recording media according to claim 17, wherein said lower layer has a thickness of 60 to 100 nm and said intermediate layer has a thickness of 20 to 150 nm.

20. A method of manufacturing a recording original disc for optical information recording media comprising the steps of:.

forming a lower layer of a first etching applied-material onto a surface of a substantially flat substrate, the first etching-applied material being one of $SiO_2$ and $Si_3N_4$;

forming an intermediate layer of a second etching-applied material on said lower layer, the second etching-applied material being Si;

forming an upper layer of positive type photoresist on said intermediate layer;

exposing said upper layer of positive type photoresist to light to form a pattern corresponding to recording information, a shape of a latent image which is formed on said upper layer of positive type photoresist by said exposure being a substantially Gaussian distribution which causes first side walls of said upper layer of positive type photoresist to be slanted with respect to a vertical axis of said disc, and decreasing in width in a direction from said upper layer of positive type photoresist towards said intermediate layer;

developing said upper layer of positive type photoresist to remove said latent image formed in said upper layer of positive type photoresist, thus forming a first opening portion in said upper layer of positive type photoresist having said slanted first side walls;

wherein in said exposure and development steps of said upper layer of positive type photoresist, said intermediate layer remains unchanged when exposed to said light and said development;

exposing said upper layer of positive type photoresist having said first opening portion to far ultraviolet radiation, said upper layer of positive type photoresist being subsequently subjected to heat treatment;

etching said intermediate layer using reactive ion etching while using as a mask said upper layer of positive type photoresist which has been exposed to light and developed, thus forming a second opening portion in said intermediate layer having second side walls, said second side walls being slanted from a perpendicular and decreasing in width in a direction from said intermediate layer towards said lower layer;

removing any residual upper layer of positive type photoresist left after said reactive ion etching using an ashing treatment using oxygen plasma; and etching said lower layer by reactive ion etching while using as a mask said intermediate layer, thus forming a third opening portion in said lower layer, with side walls of said third opening portion being substantially perpendicular to said surface of said substrate, thus forming a recording original disc.

21. The method of manufacturing a recording original disc for optical information recording media according to claim 20, wherein an etching selection ratio of said lower layer to said intermediate layer during said etching of said lower layer is set to 10 or more.

22. The method of manufacturing a recording original disc for optical information recording media according to claim 20, wherein said lower layer has a thickness of 60 to 100 nm and said intermediate layer has a thickness of 20 to 150 nm.

23. The method of manufacturing a recording original disc for optical information recording media according to claim 20, wherein a material used for said substrate and said first etching-applied material are the same material, and thus said substrate and said lower layer are formed simultaneously in a single step.

24. A method of manufacturing a recording original disc for optical information recording media comprising the steps of:

forming a lower layer of a first etching-applied material onto a surface of a substantially flat substrate, the first etching-applied material being an organic material;

forming an intermediate layer of a second etching-applied material on said lower layer, the second etching-applied material being one of Si, $SiO_2$ and $Si_3N_4$;

forming an upper layer of positive type photoresist on said intermediate layer;

exposing said upper layer of positive type photoresist to light to form a pattern corresponding to recording information, a shape of a latent image which is formed on said upper layer of positive type photoresist by said exposure being a substantially Gaussian distribution which causes first side walls of said upper layer of positive type photoresist to be slanted with respect to a vertical axis of said disc, and decreasing in width in a direction from said upper layer of positive type photoresist towards said intermediate layer;

developing said upper layer of positive type photoresist to remove said latent image formed in said upper layer of positive type photoresist, thus forming a first opening portion in said upper layer of positive type photoresist having said slanted first side walls;

wherein in said exposure and development steps of said upper layer of positive type photoresist, said intermediate layer remains unchanged when exposed to said light and said development;

exposing said upper layer of positive type photoresist having said first opening portion to far ultraviolet radiation, said upper layer of positive type photoresist being subsequently subjected to heat treatment;

etching said intermediate layer using reactive ion etching while using as a mask said upper layer of positive type photoresist which has been exposed to light and developed, thus forming a second opening portion in said intermediate layer having second side walls, said second side walls being slanted from a perpendicular and decreasing in width in a direction from said intermediate layer towards said lower layer;

removing any residual upper layer of positive type photoresist left after said reactive ion etching using an ashing treatment using oxygen plasma; and etching said lower layer by reactive ion etching while using as a mask said intermediate layer, thus forming a third opening portion in said lower layer, with side walls of said third opening portion being substantially perpendicular to said surface of said substrate, thus forming a recording original disc.

25. The method of manufacturing a recording original disc for optical information recording media according to claim 24, wherein an etching selection ratio of said lower layer to said intermediate layer during said etching of said lower layer is set to 10 or more.

26. The method of manufacturing a recording original disc for optical information recording media according to claim 24, wherein the first etching-applied material is polyvinyl cinnamate, a mixture of polyvinyl phenol and aromatic bisazide, a mixture of alkali soluble phenol resin and naphthoquinone diazide, polymethylmethacrylate, a compound of cresol novolak and naththoquinone diazide, polyhexafluorobutylmethacrylate, polybutenesulfone, chloromethylated polystyrene, polycarbonate, amorphous polyolefine, and epoxy resin.

* * * * *

UNITED STATES PATENT AND TRADEMARK OFFICE
CERTIFICATE OF CORRECTION

PATENT NO. : 6,228,562 B1  Page 1 of 1
APPLICATION NO. : 08/729417
DATED : May 8, 2001
INVENTOR(S) : Yoshitaka Kawanishi It is certified that error appears in the above-identified patent and that said Letters Patent is hereby corrected as shown below:

Title Page item 57
In the Abstract line 20, after "D " insert --(n x d)--

Signed and Sealed this

Fifteenth Day of January, 2008

JON W. DUDAS
*Director of the United States Patent and Trademark Office*